United States Patent [19]
Tanaka

[11] 4,089,024
[45] May 9, 1978

[54] SEMICONDUCTOR SWITCHING DEVICE

[75] Inventor: Tomoyuki Tanaka, Hitachi, Japan

[73] Assignee: Hitachi, Ltd., Japan

[21] Appl. No.: 640,714

[22] Filed: Dec. 15, 1975

Related U.S. Application Data

[63] Continuation of Ser. No. 398,446, Sep. 18, 1973, abandoned.

[30] Foreign Application Priority Data

Sep. 20, 1972 Japan .................................. 47-93623

[51] Int. Cl.² .............................................. H01L 29/74
[52] U.S. Cl. ........................................ 357/38; 357/39; 357/51; 357/55; 357/64; 357/86
[58] Field of Search ....................... 357/38, 39, 64, 37, 357/86, 51, 55

[56] References Cited

U.S. PATENT DOCUMENTS

| 3,246,172 | 4/1966 | Sanford | 357/64 |
| 3,284,680 | 11/1966 | Gentry et al. | 357/38 |
| 3,681,667 | 8/1972 | Kokosa | 357/39 |
| 3,967,308 | 6/1976 | Yatsuo et al. | 357/38 |

FOREIGN PATENT DOCUMENTS

| 1,282,194 | 11/1968 | Germany | 357/38 |
| 2,128,304 | 12/1971 | Germany | 357/38 |

*Primary Examiner*—Stanley D. Miller, Jr.
*Assistant Examiner*—Joseph E. Clawson, Jr.
*Attorney, Agent, or Firm*—Craig & Antonelli

[57] ABSTRACT

A semiconductor switching device including at least three PN junctions and a control electrode formed on a portion of the surface of one outermost layer out of the layers constituting said PN junctions, wherein, in order to positively ensure that it turns off, the forward voltage drop across a current path including a portion of the outermost layer near the control electrode is made greater than that across the main current path.

21 Claims, 8 Drawing Figures

SEMICONDUCTOR SWITCHING DEVICE

This is a continuation of application Ser. No. 398,446, filed Sep. 18, 1973, now abandoned.

BACKGROUND OF THE INVENTION

1. Field of the Invention

This invention relates to a semiconductor switching device having a control electrode such as a thyristor or a bidirectional thyristor.

2. Description of the Prior Art

In general, thyristors refer to those of the type which comprise a semiconductor body consisting of four layers of alternately different conductivity type such as PNPN, anode and cathode electrodes contacted in a low resistance condition with at least both outer layers of the body, respectively, and a control electrode or a gate electrode for igniting the thyristor contacted with any one layer of the body, and which is switched from a non-conducting condition to a conducting condition in response to a control signal applied to the control electrode. The control electrode of such a semiconductor device is usually connected directly to an intermediate layer or an outer layer, but is often connected through a gate region formed in the outer layer and having conductivity opposite thereto. A device having the latter type of control electrode may be used in such a circuit arrangement that two thyristors connected in parallel with opposite polarities to each other are used to be operated by a single control circuit. In a semi-conductor device with such a control electrode of the type connected through a gate region formed in the anode side outer layer, such as disclosed in U.S. Pat. No. 3,284,680 to F. E. Gentry et al. (this type control electrode is hereinafter called a "remote gate"), the so-called turn-off failure by which the semiconductor device does not effect its desired operation upon transition from a conducting state to a non-conducting state is often brought about when a shorted emitter structure such as disclosed in U.S. Pat. No. 3,476,993 to R. W. Aldrich et al is taken so as to prevent the influence upon the forward breakover voltage due to the increase in temperature and/or the rate of increase in an applied forward voltage.

SUMMARY OF THE INVENTION

Therefore, a primary object of this invention is to provide a semiconductor switching device with a control electrode that is free from turn-off failure and, therefore, has high reliability.

Another object of this invention is to provide a semiconductor switching device with a control electrode that is free from turn-off failure while holding the advantages resulting from a shorted emitter structure.

Still another object of this invention is to provide a unidirectional or bidirectional thyristor having a novel construction.

A semiconductor device according to this invention incorporates therein a shorted emitter structure and a remote gate system, and is provided between a control electrode and a main electrode on the same side of a semiconductor body with an auxiliary region for reducing the current flowing in the auxiliary region in the conducting state of the device, so that when the voltage applied between the main electrode and another main electrode is so changed as to cause the device to turn from the conducting state into the non conducting state, the carriers which have been accumulated in the auxil-iary region are reduced thereby to prevent the occurrence of turn-off failure.

DESCRIPTION OF THE PREFERRED EMBODIMENTS

Figure 1:
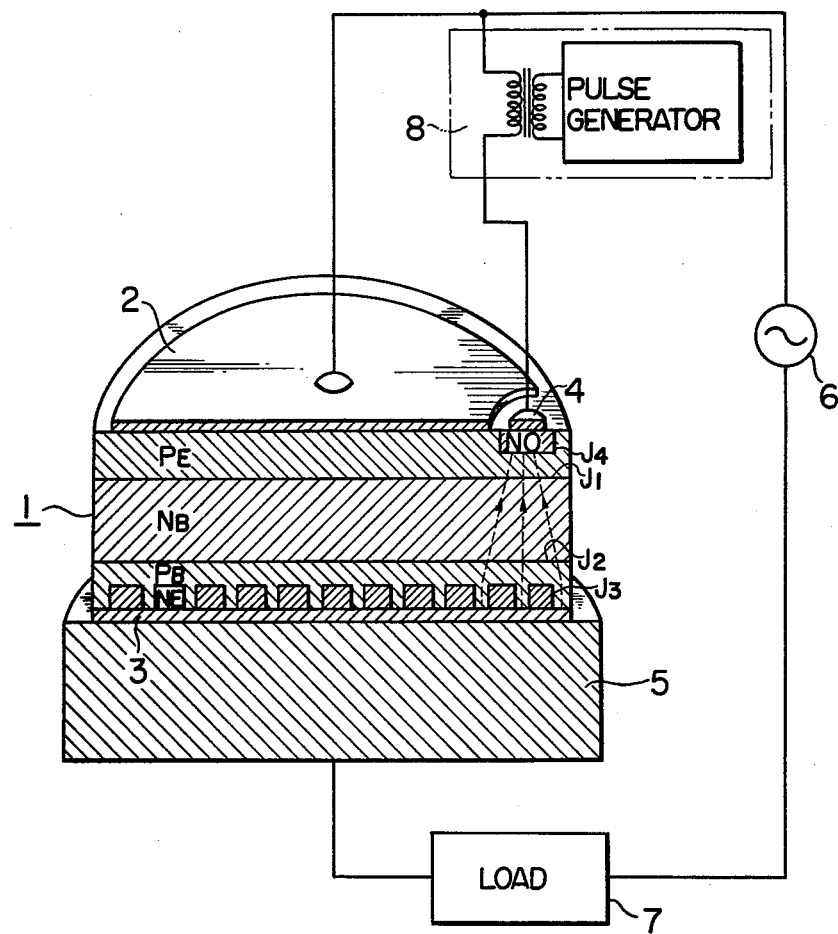
FIG. 1 is a diagrammatical view of a shorted emitter thyristor shown in section and of a related circuitry for driving the thyristor to cause the current to flow through a load connected in series to the thyristor together with a power source.

First, reference will be made to FIG. 1 showing a device for the better understanding of this invention.

In this Figure, thyristor 1 comprises P type emitter layer $P_E$, N type base layer $N_B$, P type base layer $P_B$, N type emitter layer $N_E$ and N type gate region $N_O$ which is buried in the P type emitter layer $P_E$ and of which the surface is exposed at the surface of the layer $P_E$, the P type base layer $P_B$ extending through the layer $N_E$ to its exposed surface at predetermined portions. Anode electrode 2 and cathode electrode 3 are contacted in a low resistance condition or ohmically with the exposed surface of the P type emitter layer $P_E$ and the exposed surfaces of the N type emitter and P type base layer $N_E$ and $P_B$, respectively, so that the P type base layer and N type emitter layer are electrically shorted. Control electrode or gate electrode 4 is connected ohmically to the exposed surface of the gate region $N_O$. In order to support the thyristor 1 cathode electrode terminal 5 is provided in ohmic contact with the cathode electrode 3 as shown in FIG. 1.

In the operation of this conventional type remote gate thyristor, usually main power supply 6 and load 7 are connected in series between the anode electrode 2 and the cathode electrode 3, and further, control electrode driving circuit 8 comprising a pulse generator and a pulse transformer is connected between the control electrode 4 and the anode electrode 2. This thyristor in a non-conducting state is brought into a conducting state when a positive voltage is applied to the anode electrode 2 with respect to the cathode electrode 3 and at the same time a control signal is applied between the anode and control electrodes 2 and 4 in the form of a pulse of such polarity that the electric potential on the control electrode is negative with respect to that on the anode electrode. When the voltage polarity between the anode and cathode electrodes 2 and 3 of the thyristor in the conducting state is inverted, the thyristor changes to the non-conducting state. However, with a thyristor of the shorted emitter type having a remote gate as shown in FIG. 1, it often occurs that the transition from the conducting state to the non-conducting state is not carried out satisfactorily.

That is to say, in the forward blocked condition of the thyristor, when a control signal in the form of a voltage of such polarity that the potential on the control electrode 4 is negative with respect to that on the anode electrode 2 is applied between the anode and control electrodes 2 and 4, P-N junction $J_4$ between the gate region $N_O$ and P type emitter layer $P_E$ is forward biased so that electrons are injected from the gate region $N_O$ into P type emitter layer $P_E$. A portion of the injected electrons reach N type base layer $N_B$ and contribute to the forward biasing of the P-N junction $J_1$ between the P type emitter layer $P_E$ and N type base layer $N_B$. As a result, the number of holes injected from the P type emitter layer $P_E$ into the N type base layer $N_B$ increases, and of these holes, those which reach the P type base layer $P_B$ raise the electric potential at the P type base layer $P_B$, so that the electron injection from the N type emitter layer $N_E$ into the P type base layer $P_B$ is promoted. A portion of the electrons injected into the P type base layer $P_B$ reach the N type base layer $N_B$ to forward bias P-N junction $J_1$ more strongly. As a result of such internal interactions, the carriers are accumulated within the N type base layer $N_B$ and P type base layer $P_B$ of the thyristor, and P-N junction $J_2$ between the N type base layer $N_B$ and P type base layer $P_B$ is also forward biased, whereby the thyristor turns into a conducting state. During the very initial period of conduction, conducting are only those portions of the layers $P_E$, $N_B$, $P_B$ and $N_E$ which are near to the gate region $N_O$ and a load current flows through such portions, but it spreads throughout the portions underlying the whole area of anode electrode 2 in a short time. Next, when the polarity of the applied voltage between the anode electrode 2 and cathode electrode 3 is inverted, the carriers accumulated within the N type base layer $N_B$ and P type base layer $P_B$ at the time of conduction are drawn out. On the other hand, since this thyristor is of the shorted emitter type, between the control and cathode electrodes 4 and 3 a four-layer section comprising gate region $N_O$, P type emitter layer $P_E$, N type base layer $N_B$ and P type base layer $P_B$ is formed, this four-layer section being in a forward biased when between the anode and cathode electrodes 2 and 3 a voltage for bringing the thyristor into a non-conducting state is applied. Therefore, when the carriers which have been accumulated within the layers $N_B$ and $P_B$ are drawn out in the four-layer section with the gate region $N_O$ serving as its one outermost layer, the flow of said carriers acts as a control signal so that the four-layer section changes to the conducting state, and, accordingly, the thyristor as a whole does not turn into a non-conducting state, but loses its function as a thyristor. Such turn-off failure would often bring about serious problems in an apparatus using a thyristor, such as a vehicle, an electric power conversion apparatus or the like. This, of course, it quite the same with respect to a bidirectional thyristor, too.

Figure 2:
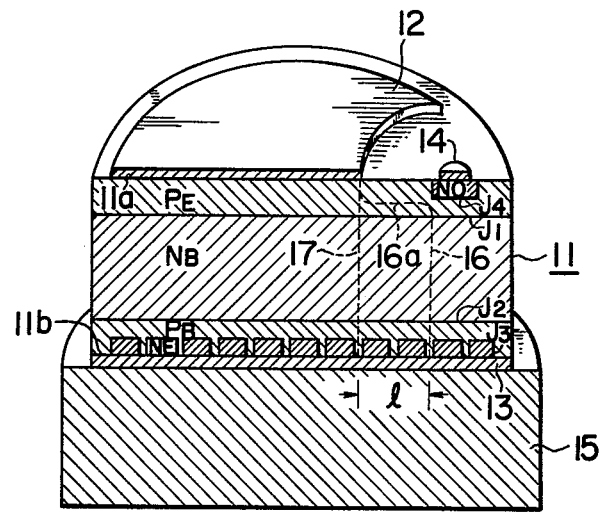
FIG. 2 is a diagrammatical view of an embodiment of the switching device according to this invention adapted to prevent turn-off failure by separating, by a predetermined distance, the anode electrode from the gate region provided with a control electrode.

FIG. 2 shows a semiconductor switching device according to this invention wherein an anode electrode and a gate region provided with a control electrode are separated a predetermined distance $l$ thereby to prevent the device from being subjected to turn-off failure. In this Figure, semiconductor body 11 comprises four successive layers of alternately different conductivities, one outermost layer of P type emitter $P_E$, one intermediate layer of N type base $N_B$, another intermediate layer of P type base $P_B$ and another outermost layer of N type emitter $N_E$, arranged between main surfaces 11a and 11b, and gate region $N_O$ of the N conductivity type buried in P type emitter layer $P_E$ with its surface being exposed at the surface 11a. The P type base layer $P_B$ is exposed at predetermined portions on the main surface 11b by extending through the N type emitter layer $N_E$. Anode electrode 12 is in ohmic contact with the surface of the P type emitter layer $P_E$ or the main surface 11a with the edge of the anode electrode facing the gate region $N_O$ being separated a predetermined distance $l$ from the region $N_O$. Cathode electrode 13 is in ohmic contact condition with the exposed surfaces of the N type emitter layer $N_E$ and P type base layer $P_B$, that is, the main surface 11b. Control electrode 14 is ohmically connected to the exposed surface of the gate region $N_O$. A reinforcing member or cathode electrode terminal 15 for semiconductor body 11 is connected to the cathode electrode 13 in such a manner as shown in FIG. 2.

In the remote gate semiconductor switching device, when, under such a condition that a positive voltage is applied to the anode electrode 12 with respect to the cathode electrode 13, a control signal which forward biases P-N junction $J_4$ between the P type emitter layer $P_E$ and gate region $N_O$ is applied between the anode and control electrodes 12 and 14, the electrons are injected from the gate region $N_O$ into the P-type emitter layer $P_E$ to bring the device into a conducting state in accordance with the same mechanism as in FIG. 1. This is called "turn-on". A load current flows initially through a path shown by dotted line 16. The path as shown by the dotted line 16 includes path portion 16a in the transverse direction in the P type emitter layer $P_E$, which transverse path portion 16a is high in resistance with respect to the remaining portion, so that, when current flows along the path shown by dotted line 16, a considerable voltage drop is produced. This voltage drop will forward bias the portion of the P-N junction $J_1$ beneath the edge portion of anode electrode 12 to change the flow of the load current from the path shown by dotted line 16 to another path shown by dotted line 17. Thereafter, the conductive path spreads to a main region of the four-layer portion underlying the anode electrode 12. At the same time, the load current flowing through an auxiliary region of the four-layer portion which is between the dotted lines 16 and 17 becomes small to substantially the same extent as in the non-conducting state. As a result, in the auxiliary region and controlling region underlying the control electrode 14 there is no excess accumulation of carriers, so that the rate-of-rise of an applied voltage capability in the period of backward recovery becomes high to substantially the same extent as the forward dv/dt capability. In this way, turn-off failure can be prevented.

In the present invention it is important to decide the distance $l$ by which the auxiliary region is defined. If the distance $l$ is not sufficiently larger than the diffusion length of carriers in the semiconductor body, an effect of the auxiliary region on elimination of the undesirable mutual effect which is caused by excess carriers drifting near the controlling region is not satisfactory. It has been found that the distance $l$ larger than three times the diffusion length is necessary for the purpose of the present invention. Particularly, the distance $l$ larger than five time the diffusion length is preferable. The upper limit of the distance $l$ may be determined in accordance with the mass effect of the semiconductor body or any other bases. In conventional thyristors for power use, which generally have a large diameter such as 10 mm. and 30 mm. or more and have a diffusion length of about 0.035 to 0.5 mm, the distance between the edge of anode 12 and the gate region is at most 0.01 mm, in general 0.05 to 0.1 mm for thyristors of 30 mm diameter class. According to the preferred embodiment of the present invention, the distance $l$ is five times the diffusion length, i.e. 0.2 to 2.5 mm, which may vary with the diameter of semi-conductor body.

The test results of comparison of a conventional shorted emitter remote gate thyristor shown in FIG. 1 with the inventive one are shown in the following. These thyristors had the following particulars:

The thickness and impurity concentration of the $P_E$ layer, $N_B$ layer, $P_B$ layer, $N_E$ layer and $N_O$ layer was 80 $\mu$ and $1 \times 10^{19} cm^{-3}$, 226 $\mu$ and $1 \times 10^{14} cm^{-3}$, 50 $\mu$ and $2 \times 10^{15} cm^{-3}$, 30 $\mu$ and $1 \times 10^{20} cm^{-3}$, and 30 $\mu$ and $1 \times 10^{20} cm^{-3}$, respectively. The diameter of the semiconductor body was 16 mm. In the conventional thyristor the distance between the edge of anode 2 and the edge of $N_O$ layer was 0.2 mm. On the other hand, in the inventive thyristor the distance $l$ was 1 mm. Since the diffusion length of carriers with respect to each of the thyristors was about 0.1 mm, the distance in the former was twice that diffusion length, but the distance $l$ in the latter was ten times.

According to the operation tests of the conventional thyristor mentioned above, it was found that it had the current capability $di/dt$ at which the turn-off failure occurred, when the voltage capability $dv/dt$ was 60 V/$\mu$s. To the contrary, the inventive thyristor showed no turn-off failure even when the current capability $di/dt$ was 80 A/$\mu$s and the voltage capability $dv/dt$ was 140 V/$\mu$s.

Figure 3:
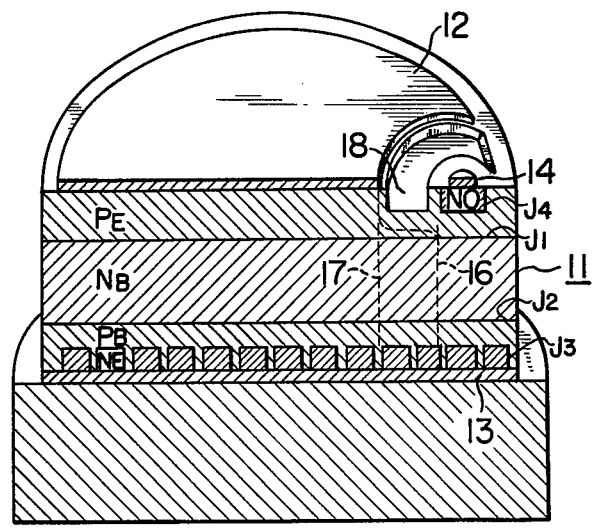
FIG. 3 is a similar view to FIG. 2 showing another embodiment of the switching device according to this invention adapted to prevent turn-off failure by forming a groove between the anode electrode and the gate region in one layer of the semiconductor body which is contacted with the anode electrode and provided therein with the gate region with a control electrode.

FIG. 3 shows another type remote gate semiconductor switching device according to this invention adapted to prevent turn-off failure by forming a groove in a P type emitter layer between an anode electrode and a gate region with a control electrode. In FIG. 3, groove 18 whose bottom does not reach the PN junction $J_1$, is provided in P type emitter layer $P_E$ between anode electrode 12 and gate region $N_O$ with control electrode 14 to substantially increase the transverse resistance of the residual part of the $P_E$ layer. The others are in the same structure as of FIG. 2.

In such construction, since a load current flows along a path shown by dotted line 16 at the initial period of conduction of the device and this path extends transversely in the P type emitter layer of which the resistance in the transverse direction is increased by the groove 18, the current path is transferred from the path 16 to a path shown by dotted line 17 in the same manner as described with reference to FIG. 2, and, thereafter, the conducting path spreads to a main region of the four-layer portion underlying the anode electrode 12. When the conducting path spreads to such portion, an auxiliary region of the four-layer portion substantially underlying the gate region $N_O$ and the groove 18 turns into a substantially non-conducting state because the voltage drop in the forward direction across this auxiliary region is greater than that across the main region. Therefore, the carriers which have been accumulated within the auxiliary region underlying the gate region $N_O$ and groove 18 almost disappear, so that turn-off failure upon transition of the polarity of the applied voltage between the anode electrode 12 and the cathode electrode 13 can be prevented. It is preferable that the width of the groove be sufficiently greater than the diffusion length of carriers.

In the embodiment shown in FIG. 3, the depth and width of the groove 18 were 40 mm and 1 mm, respectively. In this embodiment, the size of semiconductor body was the same as in the embodiment described with reference to FIG. 2.

The embodiment shown in FIG. 3 has advantages that the turn-on and turn-off characteristics can be adjusted by changing the resistance in the transverse direction of the P type emitter layer $P_E$ through adjustment of the width and/or depth of the groove and that the distance between the anode electrode and the gate region can be made smaller than in the case of FIG. 2. Such construction can, therefore, contribute to reduction in the size of the semiconductor body.

Figure 4:
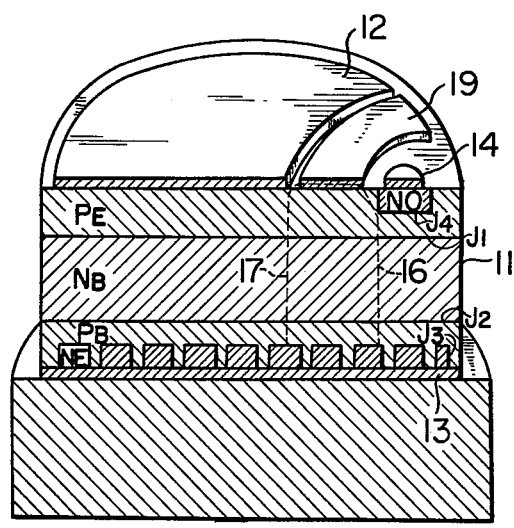
FIG. 4 is a similar view to FIGS. 2 and 3 showing another embodiment of the switching device according to this invention adapted to prevent turn-off failure by separating the anode electrode from the gate region by a predetermined distance.

FIG. 4 shows still another type remote gate semiconductor switching device according to this invention adapted to prevent turn-off failure by forming a predetermined distance between anode electrode 12 and gate region $N_O$. That is, part 19 of anode 12 is cut off from the anode 12 so as to made the distance between anode electrode 12 and gate region $N_O$. The metal film 19, which has no longer function as an anode, may be used to control the resistance of a transverse direction of the layer $P_E$ between anode and control electrodes 12 and 14. The others are in the same structure as of FIG. 2. The principle on which turn-off failure can be prevented is the same as in FIGS. 2 and 3.

Figure 5:
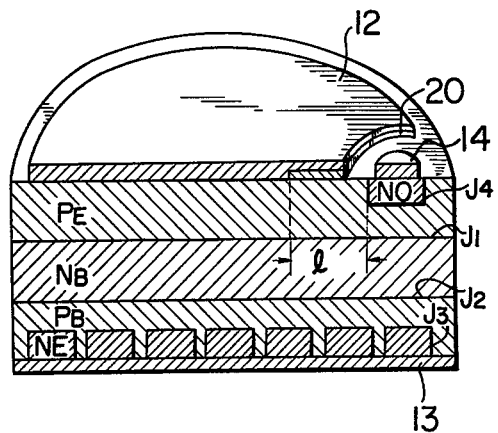
FIG. 5 is a similar view to FIGS. 2 to 4 showing another embodiment of the switching device according to this invention adapted to prevent turn-off failure by forming a resistive film on the exposed surface of the semiconductor body between the anode electrode and the gate region.

FIG. 5 shows still another type remote gate semiconductor switching device according to this invention adapted to prevent turn-off failure by resistive film 20 formed on the surface between anode electrode 12 and gate area $N_O$, whereby anode 12 is electrically apart from gate region $N_O$ by a distance enough to prevent a mutual effect due to carriers between the main region underlying the anode 12 and the controlling region. The resistive film 20 may be made of a material such as a metallic oxide, a conductive organic material or an alloy, which should have a resistance sufficiently greater than that of the anode electrode. It is preferable that the width $l$ of the resistive film 20 be far greater than the diffusion length of carriers. The others are in the same structure as of FIG. 2. With such construction, in addition to being possible to prevent turn-off failure, the switching device performs a stabilized operation for the following reason: The surface of the semiconductor body tends to be affected by the atmosphere because of its activity, and, therefore, with the exposed surface of the P type emitter layer, the characteristics of the device may be unstable, but since the P type emitter layer $P_E$ between the anode 12 and gate electrode 14 is covered by resistive film 20, the characteristics of the thyristor can be stabilized.

Figure 6:
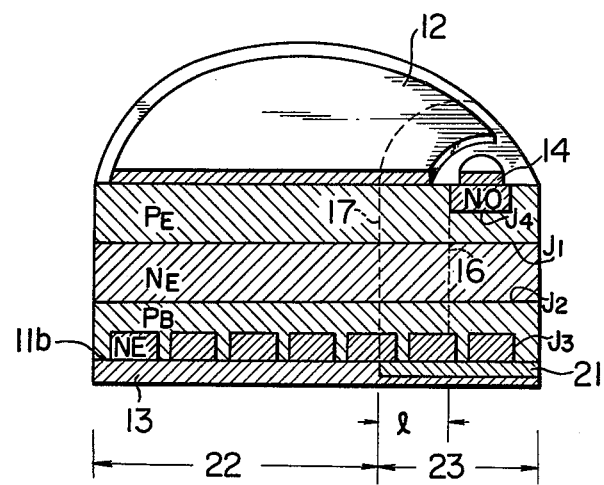
FIG. 6 is a similar view to FIGS. 2 to 5 showing another embodiment of the switching device according to this invention adapted to prevent turn-off failure by providing a resistive film at the side of the semi-conductor body where a cathode electrode is in low ohmic contact.

FIG. 6 shows still another type remote gate semiconductor switching device according to this invention adapted to prevent turn-off failure by providing a resistive film 21 on a portion of main surface 11b facing gate region $N_O$ and a portion adjacent thereto. The film 21 may be covered with a portion of the cathode electrode 13. Resistive film 21 has a resistance value in the forward direction of 0.01 to 0.1 Ω, preferably. As is shown in FIG. 6, the film 21 is further electrically contacted with portions of the layers $P_B$ and $N_E$. The others are in the same structure as of FIG. 2.

In such a device, under a condition that a positive voltage is applied to the anode electrode 12 with respect to the cathode electrode 13, when a control signal voltage is applied between the anode electrode 12 and control electrode 14, then, regardless of the exsistance of the resistive film 21, conduction is initiated at the end area of the anode electrode 12 near the control electrode 14 in the same manner as described above and a load current flows along the path shown by dotted line 16. The conducting path spreads with the lapse of time and a main region consisting of four-layer portion 22 underlying the cathode electrode 13 wholly turns into a conducting state. Upon spreading of the conducting area, the current path (shown by dotted line 16) passing through four-layer area portion 23 underlying the resistive film 21 becomes greater in forward voltage drop than the other portion because of the exsistance of the resistive film 21, and, therefore, the main region 22 underlying the cathode electrode 13 turns into a conducting state, while the other portion 23 turns into a substantially non-conducting state. Accordingly, when the polarity of the voltage applied between the anode electrode 12 and cathode electrode 13 is inverted, no excess carriers exist within the portion 23, so that there is no fear of turn-off failure.

Figure 7:
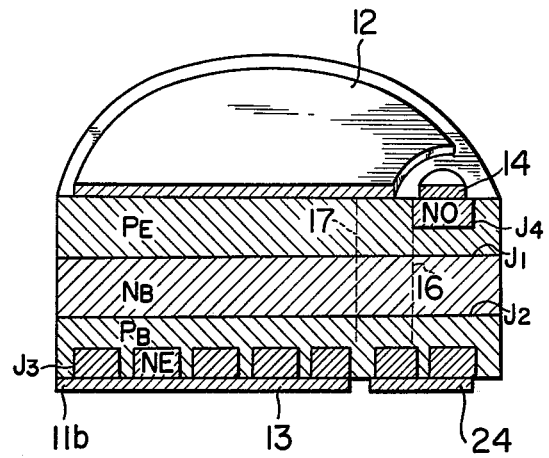
FIG. 7 is a similar view to FIGS. 2 to 6 showing another embodiment of the switching device according to the invention adapted to prevent turn-off failure by separating a part of the outermost layer to which a cathode is connected from the residue of the outermost layer.

FIG. 7 shows still another type remote gate semiconductor switching device according to this invention adapted to prevent turn-off failure by separating part of the outermost layer $N_E$ from the other part and forming a subsidiary electrode 24 being separated from cathode 13, on the outermost layer $N_E$, whereby an auxiliary region is formed between the edge of cathode 13 and the edge of anode 12, the distance which is made larger than the diffusion length of carriers being defined by dotted lines 16 and 17. The others are in the same structure as of FIG. 2.

In such construction, during the initial period of conduction or turn-on, a load current flows from anode electrode 12 through path 16, subsidiary electrode 24 and P type base layer $P_B$ and junction $J_3$ to cathode electrode 13. This load current functions as a gate current with respect to the N type emitter layer $N_E$ contacted with cathode electrode 13 because it flows across the junction $J_3$ as described above. Therefore, next, path 17 conducts, and, thereafter, the conducting path spreads to the portion ohmically connected to the cathode electrode 13. On the other hand, since the voltage drop across path 16 is greater than the voltage drop across path 17, the four-layer portion overlying the subsidary electrode 21 is deenergized. For this reason, turn-off failure can be prevented, and, further, upon turn-on the gate region amplifies the gate current to ignite the device from all the circumferences of the junctions $J_3$. Therefore, the effect of increasing the rate-of-rise of current capability $di/dt$ of the device can be obtained.

Further, as another embodiment of this invention, a remote gate device adapted to prevent turn-off failure is further improved by doping deep level atoms which serve as recombination centers in an auxiliary region defined by the dotted lines 16 and 17 shown in FIGS. 2 – 8. The deep level atoms to be used for the purpose of the present invention include gold, platinum, iron, and so on.

Furthermore, this invention is applicable to a bidirectional semiconductor switching device. One example thereof is shown in FIG. 8.

Figure 8:
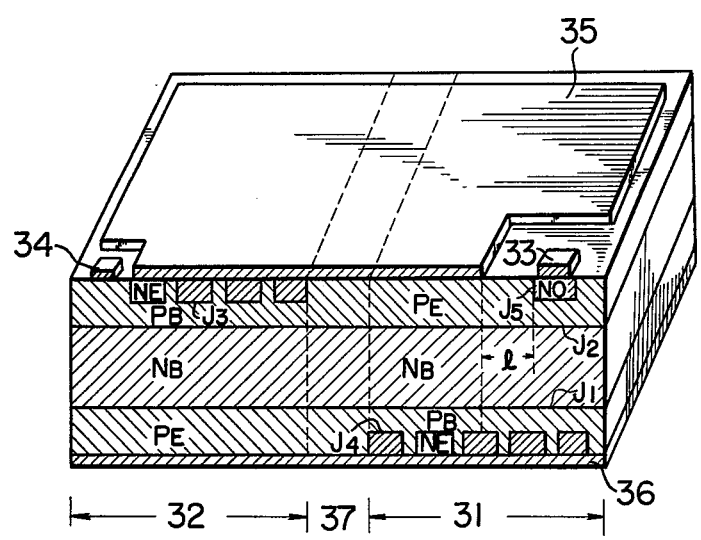
FIG. 8 is a diagrammatical view showing another embodiment of the switching device capable of a bidirectional operation.

The bidirectional thyristor shown in FIG. 8 consists of a first thyristor portion 31, a second thyristor portion 32 and an isolation region 37. The first thyristor portion 31 comprises a main region formed between anode 35 and cathode 36, an auxiliary region having the distance $l$, which is sufficiently larger than the diffusion length of carriers, and a control region defined by gate electrode 83, gate region $N_O$, and part of a semiconductor body underlying the gate region $N_O$ and cathode 36. The second thyristor region 32 comprises a main region underlying anode 35 and a gate region provided with gate electrode 34. In this case, the bidirectional thyristor has two thyristor sections 31 and 32 with individual control electrodes 33 and 34, respectively, on the same main surface. Only one thyristor section 31 has a remote gate system with gate region $N_O$ separated a predetermined distance from the end portion of main electrode 35 facing the control electrode 33 in the same manner as in FIG. 2. With this construction, turn-off failure (commutation failure) at the time of commutation from thyristor portion 31 to thyristor portion 32 can be prevented. FIG. 8 shows the case where two control electrodes are provided, but the technical concept of this invention is also applicable in the case where only one control electrode is provided between two thyristor sections, in which case the control electrode is contacted with both the gate region and the adjacent portion. Also, FIG. 8 shows that case where the remote gate system shown in FIG. 2 is applied to the bidirectional thyristor, but the embodiments as shown in FIGS. 3 to 7 are also applicable to the bidirectional thyristor.

The foregoing description relates to the case where gate region $N_O$ is provided in a P type emitter layer $P_E$, but it is to be noted that, even if the gate region is provided in an N type emitter layer $N_E$, the same effects and advantages are obtainable also therefrom.

While only particular embodiments of the invention have been shown and explained, it will be apparent to those skilled in the art that various changes and modifications may be made therein without departing from the invention in its broader aspects. Therefore, the aim in the appended claims is to cover all such changes and modifications as may fall within the true spirit and scope of the invention.

I claim:

1. In a semiconductor switching device comprising four semiconductor layers formed one upon another each having a conductivity type different from the adjacent layer to constitute three P-N junctions, a first region formed in a part of the surface of one of the outermost layers and having a conductivity type different from that of said one outermost layer, a part of one intermediate layer adjacent to the other outermost layer being exposed to the surface of said other outermost layer, a first main electrode in ohmic contact with said one outermost layer, a second main electrode in ohmic contact with said other outermost layer and also with said one intermediate layer adjacent to said other outermost layer, and a control electrode in ohmic contact with said first region, the improvement comprising an auxiliary region for substantially eliminating mutual affection due to carriers between the main region formed between said first and second main electrodes and controlling region formed between said control electrode and said second main electrode when said control electrode is not triggered.

2. A semiconductor switching device comprising:
  a semiconductor body including
    a first semiconductor layer of a first conductivity type,
    a second semiconductor layer of a second conductivity type, opposite said first conductivity type, contacting a first surface of said first semiconductor layer and defining a first PN junction therewith,
    a third semiconductor layer of said first conductivity type having a first surface contacting said second semiconductor layer and defining a second PN junction therewith,
    a first semiconductor region of said second conductivity type disposed in a second surface of said third semiconductor layer, opposite the first surface thereof contacting said second semiconductor layer, and defining a third PN junction therewith, and
    a second semiconductor region of said second conductivity type disposed in a first prescribed portion of a second surface of said first semiconductor layer, opposite the first surface thereof contacting said second semiconductor layer, and defining a fourth PN junction therewith,
  a first main electrode disposed on a second prescribed portion of said second surface of said first semiconductor layer, spaced apart from said first prescribed portion thereof;
  a second main electrode disposed on said second surface of said third semiconductor layer so as to contact both said third layer proper and said first semiconductor region disposed therein; and
  a control electrode disposed in contact with said second semiconductor region on said first prescribed portion of said second surface of said first semiconductor layer spaced apart from said first main electrode;
  wherein that portion of the semiconductor body between the projection of those areas, in a direction perpendicular to the second surfaces of said first and third semiconductor layers, whereon said first and second main electrodes contact said first and third layers, respectively, on each other, which projection is a common projection thereof, comprises the main region of the body, and that portion of the semiconductor body between the projection, in a direction perpendicular to the second surfaces of said first and third semiconductor layers, of said second region and said second main electrode on each other, which projection is a common projection thereof comprises the control region of the body; and wherein said device further comprises auxiliary means, disposed between said control region and said main region of said body, for effectively preventing excess carriers from drifting into said control region and turning on said control region in the absence of a trigger signal applied to said control electrode, so that upon the application of a reverse voltage between said first and second main electrodes, said device can be effectively turned off.

3. A semiconductor switching device according to claim 2, wherein auxiliary means comprises that portion of said semiconductor body between said control and main regions, the distance between which is substantially larger than the diffusion length of said carriers.

4. A semiconductor switching device according to claim 3, wherein said distance is larger than five times said diffusion length.

5. A semiconductor switching device according to claim 2, wherein said auxiliary means comprises that portion of said semiconductor body between said control and main regions and includes a groove formed in a third prescribed portion of the second surface of said first semiconductor layer between said first and second prescribed portions thereof.

6. A semiconductor switching device according to claim 2, wherein said auxiliary means comprises that portion of said semiconductor body between said control and main regions and includes a metal film disposed on a third prescribed portion of the second surface of said first semiconductor layer, between said first and second prescribed portions thereof, and separated from each of said first main electrode and said control electrode.

7. A semiconductor switching device according to claim 2, wherein said auxiliary means comprises that portion of said semiconductor body between said control and main regions and includes a resistive film formed on a third prescribed portion of the second surface of said first layer between said first and second prescribed portions, said first main electrode extending onto said resistive film, said resistive film being spaced apart from said control electrode.

8. A semiconductor switching device according to claim 2, wherein said auxiliary means comprises that portion of said body between said control and main regions and includes a resistive film formed on a first prescribed surface portion of said third semiconductor layer, said resistive film also being formed on a second prescribed surface portion of said third layer adjacent said control region, said second main electrode extending onto said resistive film.

9. A semiconductor switching device according to claim 8, wherein said resistive film has a resistance of from 0.01 to 0.1 $\Omega$.

10. A semiconductor switching device according to claim 2, wherein said auxiliary means comprises that portion of said semiconductor body between said control and main regions and wherein said second main electrode is disposed on only a first prescribed surface portion of said third layer, the projection of which, in a direction perpendicular to the second surface of said first and third semiconductor layers, defining with said first main electrode said main region, and further including a subsidiary electrode disposed on a second prescribed surface portion of said third layer spaced apart from said second main electrode on said first prescribed surface portion.

11. A semiconductor switching device according to claim 2, wherein said auxiliary means comprises that portion of said semiconductor body between said control and main regions and is doped with deep level impurities.

12. A semiconductor switching device comprising:
a semiconductor body including
  a first semiconductor layer of a first conductivity type,
  a second semiconductor layer of a second conductivity type, opposite said first conductivity type, contacting a first surface of said first semiconductor layer and defining a first PN junction therewith,
  a third semiconductor layer of said first conductivity type having a first surface contacting said second semiconductor layer and defining a second PN junction therewith,
  a first semiconductor region of said second conductivity type disposed in a second surface of said third semiconductor layer, opposite the first surface thereof contacting said second semiconductor layer, and defining a third PN junction therewith, and
  a second semiconductor region of said second conductivity type disposed in a first prescribed portion of a second surface of said first semiconductor layer, opposite the first surface thereof contacting said second semiconductor layer, and defining a fourth PN junction therewith,
a first main electrode disposed on a second prescribed portion of said second surface of said first semiconductor layer, spaced apart from said first prescribed portion thereof;
a second main electrode disposed on said second surface of said third semiconductor layer so as to contact both said third layer proper and said first semiconductor region disposed therein; and
a control electrode disposed in contact with said second semiconductor region on said first prescribed portion of said second surface of said first semiconductor layer spaced apart from said first main electrode;
wherein that portion of the semiconductor body between the projection of those areas, in a direction perpendicular to the second surfaces of said first and third semiconductor layers, whereon said first and second main electrodes contact said first and third layers, respectively, on each other, which projection is a common projection thereof, comprises the main region of the body, and that portion of the semiconductor body between the projection, in a direction perpendicular to the second surfaces of said first and third semiconductor layers of said second region and said second main electrode on each other, which projection is a common projection thereof, comprises the control region of the body; and
wherein said device further comprises auxiliary means, disposed between said control region and said main region of said body, for reducing the current flowing in the portion of said body between said control and main regions during the conducting state of said device, so that, in response to the application of a reverse voltage between said first and second main electrodes, to cause said device to become non-conductive, accumulated carriers are prevented from turning on said control region.

13. A semiconductor switching device comprising:
a semiconductor body including
  a first semiconductor layer of a first conductivity type,
  a second semiconductor layer of a second conductivity type, opposite said first conductivity type, contacting a first surface of said first semiconductor layer and defining a first PN junction therewith,
  a third semiconductor layer of said first conductivity type having a first surface contacting said second semiconductor layer and defining a second PN junction therewith,
  a first semiconductor region of said second conductivity type disposed in a second surface of said third semiconductor layer, opposite the first surface thereof contacting said second semiconductor layer, and defining a third PN junction therewith, and
  a second semiconductor region of said second conductivity type disposed in a first prescribed portion of a second surface of said first semiconductor layer, opposite the first surface thereof contacting said second semiconductor layer, and defining a fourth PN junction therewith;
a first main electrode disposed on a second prescribed portion of said second surface of said first semiconductor layer, spaced apart from said first prescribed portion thereof;
a second main electrode disposed on said second surface of said third semiconductor layer so as to contact both said third layer proper and said first semiconductor region disposed therein; and
a control electrode disposed in contact with said second semiconductor region on said first prescribed portion of said second surface of said first semiconductor layer spaced apart from said first main electrode;
wherein that portion of the semiconductor body between the projection of those areas, in a direction perpendicular to the second surfaces of said first and third semiconductor layers, whereon said first and second main electrodes contact said first and third layer, respectively, on each other which projection is a common projection thereof, comprises the main region of the body, and that portion of the semiconductor body between the projection, in a direction perpendicular to the second surfaces of said first and third semiconductor layers, of said second region and said second main electrode on each other, which projection is a common projection thereof, comprises the control region of the body; and
wherein said device further comprises auxiliary means, disposed between said control region and said main region of said body, for preventing an excess accumulation of carriers in the portion of the body between said main and control regions and in said control region, so that, upon the application of a reverse voltage between said first and second main electrodes, said device can be effectively turned off.

14. A semiconductor switching device comprising:
a semiconductor body having first and second major surfaces which comprises
  a first outer layer having a first conductivity type, an intermediate layer adjacent said first outer layer and having a second conductivity type, opposite said first conductivity type, a second outer layer adjacent said intermediate layer and having said first conductivity type, a first outermost region formed in a predetermined part of said second outer layer and having said second conductivity type, so as to form a first thyristor portion, a second outermost region formed in a predetermined part of said first outer layer and having said second conductivity type, so as to form a second thyristor portion, wherein said first and second thyristor portions are separated by an isolation region for preventing mutual interference therebetween, part of each of said first and second outer layers being exposed to each of said major surfaces, and a gate region formed in said first outer layer and having said second conductivity type;

a first main electrode in low ohmic contact with said first major surface including the surfaces of said second outermost region and said first outer layer, whereby said second outermost region and said first outer layer are electrically shorted;

a second main electrode in low ohmic contact with said second major surface including the surfaces of said first outermost region and said second outer layer, whereby said first outermost region and said second outer layer are electrically shorted;

a first gate electrode in low ohmic contact with the surface of said gate region and spaced apart from said first main electrode, whereby a control region is formed between the said gate electrode and said second main electrode; and a second gate electrode in low ohmic contact with the surface of said first outer layer, and apart from said first main electrode;

wherein that portion of the semiconductor body of said first thyristor portion between the projection of those areas, in a direction perpendicular to said first and second major surfaces, whereon said first and second main electrodes contact said outer layers, on each other, which projection is a common projection thereof, comprises the main region of said first thyristor portion; and wherein said device further comprises auxiliary means, disposed between said control region and said main region, for effectively preventing carriers from drifting into said control region and turning on said control region in the absence of a trigger signal applied to said first gate electrode.

15. A semiconductor switching device according to claim 13, wherein said auxiliary means comprises that portion of the first thyristor portion of said semiconductor body between said control and main regions, the distance between which is larger than three times the diffusion length of said carriers.

16. A semiconductor switching device according to claim 13, wherein auxiliary means comprises that portion of said semiconductor body between said control and main regions and includes a groove formed in the first major surface of said first outer layer between said first gate electrode and said first main electrode.

17. A semiconductor switching device according to claim 13, wherein said auxiliary means comprises that portion of said body between said control and main regions and includes a metal film disposed on a portion of said first outer layer spaced apart from and disposed between said first main electrode and said first gate electrode, so that said first main electrode is spaced from said first gate electrode by a distance larger than the diffusion length of said carriers.

18. A semiconductor switching device according to claim 13, wherein said auxiliary means comprises that portion of said body between said control and main regions and includes a resistive film formed on said first outer layer between main region and said control region, said resistive film being spaced apart from said first gate electrode.

19. A semiconductor switching device according to claim 13, wherein said auxiliary means comprises that portion of said body between said control and main regions and includes a resistive film on a portion of said second outer layer which extends onto said control region.

20. A semiconductor switching device comprising:

a semiconductor body having first and second major surfaces, which comprises a first outer layer having a first conductivity type, an intermediate layer adjacent said first outer layer and having a second conductivity type, opposite said first conductivity type, a second outer layer adjacent said intermediate layer and having said first conductivity type, a first outermost region formed in a predetermined part of said second layer and having said second conductivity type, so as to form a first thyristor portion, a second outermost region formed in a predetermined part of said first outer layer and having said second conductivity type so as to form a second thyristor portion, wherein said first and second thyristor portions are separated by an isolation region for preventing mutual interference therebetween, part of each of said first and second outer layers being exposed to each of said major surfaces, and a gate region formed in said first outer layer and having said second conductivity type;

a first main electrode in low ohmic contact with said first major surface including the surfaces of said second outermost region and said first outer layer, whereby said second outermost region and said first outer layer are electrically shorted;

a second main electrode in low ohmic contact with said second major surface including the surfaces of said first outermost region and said second outer layer, whereby said first outermost region and said second outer layer are electrically shorted;

a first gate electrode in low ohmic contact with surface of said gate region and spaced apart from said first main electrode, whereby a control region is formed between the said gate electrode and said second main electrode; and a second gate electrode in low ohmic contact with the surface of said first outer layer, and apart from said first main electrode;

wherein that portion of the semiconductor body of said first thyristor portion between the projection of those areas in a direction perpendicular to said first and second major surfaces whereon said first and second main electrodes contact said outer layers, on each other, which projection is a common projection thereof, comprises the main region of said first thyristor portion; and wherein said device further comprises auxiliary means, disposed between said control region and said main region, for reducing the current flowing in the portion of said body between said control and main regions during the conducting state of said first thyristor portion, so that, in response to the application of a reverse voltage between said first and second main electrodes, in said first thyristor portion, to cause said first thyristor portion to become nonconductive, accumulated carriers are prevented from turning on said control region.

21. A semiconductor switching device comprising:
a semiconductor body having first and second major surfaces which comprises
  a first outer layer having a first conductivity type,
  an intermediate layer adjacent said first outer layer and having a second conductivity type, opposite said first conductivity type,
  a second outer layer adjacent said intermediate layer and having said first conductivity type,
  a first outermost region formed in a predetermined part of said second outer layer and having said second conductivity type, so as to form a first thyristor portion,
  a second outermost region formed in a predetermined part of said first outer layer and having said second conductivity type, so as to form a second thyristor portion,
  wherein said first and second thyristor portions are separated by an isolation region for preventing mutual interference therebetween, part of each of said first and second outer layers being exposed to each of said major surfaces, and
  a gate region formed in said first outer layer and having said second conductivity type;
a first main electrode in low ohmic contact with said first major surface including the surfaces of said second outermost region and said first outer layer, whereby said second outermost region and said first outer layer are electrically shorted;
a second main electrode in low ohmic contact with said second major surface including the surfaces of said first outermost region and said second outer layer, whereby said first outermost region and said second outer layer are electrically shorted;
a first gate electrode in low ohmic contact with the surface of said gate region and spaced apart from said first main electrode, whereby a control region is formed between the said gate electrode and said second main electrode; and
a second gate electrode in low ohmic contact with the surface of said first outer layer, and apart from said first main electrode;
wherein that portion of the same semiconductor body of said first thyristor portion between the projection of those areas, in a direction perpendicular to said first and second major surfaces, whereon said first and second main electrodes contact said outer layers, on each other, which projection is a common projection thereof, comprises the main region of said first thyristor portion; and
wherein said device further comprises auxiliary means, disposed between said control region and said main region of said body, for preventing an excess accumulation of carriers in the portion of the body between said main and control regions and in said control regions, so that, upon the application of a reverse voltage between said first and second main electrodes, in said first thyristor portion, said first thyristor portion can be effectively turned off.

* * * * *